(12) United States Patent
Chen et al.

(10) Patent No.: US 12,159,904 B2
(45) Date of Patent: Dec. 3, 2024

(54) CELL PLACEMENT OPTIMIZATION

(71) Applicant: Taiwan Semiconductor Manufacturing Co., Ltd., Hsinchu (TW)

(72) Inventors: Chia-Chung Chen, Keelung (TW); Tsung-Hsin Yu, Hsinchu (TW); Chung-Hui Chen, Hsinchu (TW); Hui-Zhong Zhuang, Kaohsiung (TW); Ya Yun Liu, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 256 days.

(21) Appl. No.: 17/523,033

(22) Filed: Nov. 10, 2021

(65) Prior Publication Data
US 2022/0367637 A1   Nov. 17, 2022

Related U.S. Application Data

(60) Provisional application No. 63/188,590, filed on May 14, 2021.

(51) Int. Cl.
*H01L 29/10*   (2006.01)
*H01L 21/8234*   (2006.01)
*H01L 27/088*   (2006.01)
*H01L 29/08*   (2006.01)

(52) U.S. Cl.
CPC .. *H01L 29/1079* (2013.01); *H01L 21/823475* (2013.01); *H01L 21/823493* (2013.01); *H01L 27/088* (2013.01); *H01L 29/0847* (2013.01)

(58) Field of Classification Search
CPC ......... H01L 29/1079; H01L 21/823475; H01L 21/823493; H01L 27/088; H01L 29/0847; H01L 21/823481; H01L 27/0207; H01L 29/1087; H01L 29/78; H01L 27/11803
See application file for complete search history.

(56) References Cited

U.S. PATENT DOCUMENTS

2002/0181177 A1* 12/2002 Ker ..................... H01L 27/0251
361/56
2017/0256622 A1*  9/2017 Kim .................. H01L 21/28556

OTHER PUBLICATIONS

Yang, M.T., et al., Characterization and Model of On-Chip Flicker Noise With Deep-Nwell (DNW) Isolation for 130nm and Beyond SOC, Proc. IEEE 2005 Int. Conference on Microelectronic Test Structures, Apr. 2005, pp. 125-129, vol. 18.

(Continued)

*Primary Examiner* — Karen Kusumakar
*Assistant Examiner* — Adam S Bowen
(74) *Attorney, Agent, or Firm* — Sterne, Kessler, Goldstein & Fox P.L.L.C.

(57) ABSTRACT

The present disclosure describes structure with a substrate, a first well region, a second well region, and a third well region. The first well region is in the substrate. The second well region is in the first well region and includes a first source/drain (S/D) region. The third well region is in the substrate and adjacent to the first well region. The third well region includes a second S/D region, where a spacing between the first and second S/D regions is less than about 3 μm.

20 Claims, 17 Drawing Sheets

(56) References Cited

OTHER PUBLICATIONS

Kosaka, Daisuke et al., Isolation Strategy Against Substrate Coupling in CMOS Mixed-Signal/RF Circuits, Symposium on VLSI Circuits Digest of Technical Papers, 2005, pp. 276-279.

Rezvani, Ali G. et al., Substrate Isolation in 0.18um CMOS Technology, Proc. IEEE 2005 Int. Conference on Microelectronic Test Structures, Apr. 2005, pp. 131-136, vol. 18.

* cited by examiner

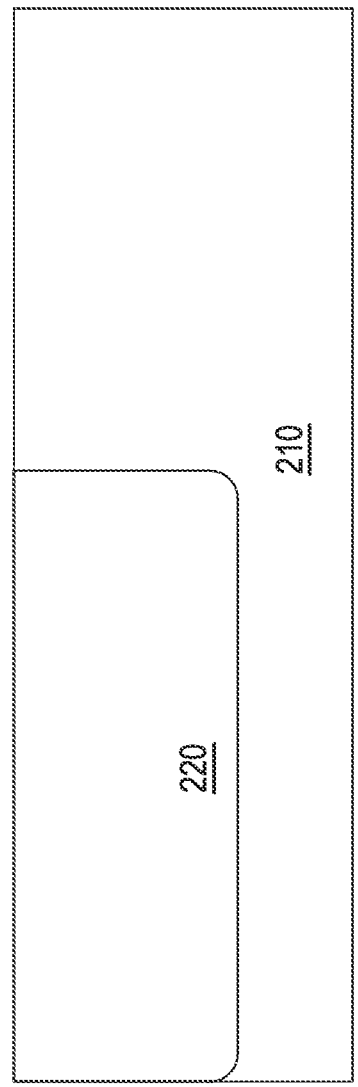

CELL PLACEMENT OPTIMIZATION

CROSS-REFERENCE TO RELATED APPLICATION

This application claims the benefit of U.S. Provisional Patent Application No. 63/188,590, titled "The Digital Fin-Boundary Enhancement for High-Speed SerDes Application," which was filed on May 14, 2021 and is incorporated herein by reference in its entirety.

BACKGROUND

An electronic design automation (EDA) tool can be used for an integrated circuit (IC) design flow. For example, the EDA tool can be used to place analog cells and digital cells (e.g., cells that implement logic functions) in an IC layout design. As technology increases and the demand for scaled ICs grow, EDA tools become increasingly important to aid in the design of complex IC layout designs, such as IC layout designs that incorporate both analog and digital cells.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

FIG. 1 is an illustration of a layout area with analog and digital cells surrounded by a common well region, according to some embodiments of the present disclosure.

FIG. 7 is an illustration of a layout area with digital cells surrounded by a common well region, according to some embodiments of the present disclosure.

FIGS. 12A-12F are illustrations of cross-sectional views of transistor structures at various points of manufacture, according to some embodiments of the present disclosure.

DETAILED DESCRIPTION

Figure 2:
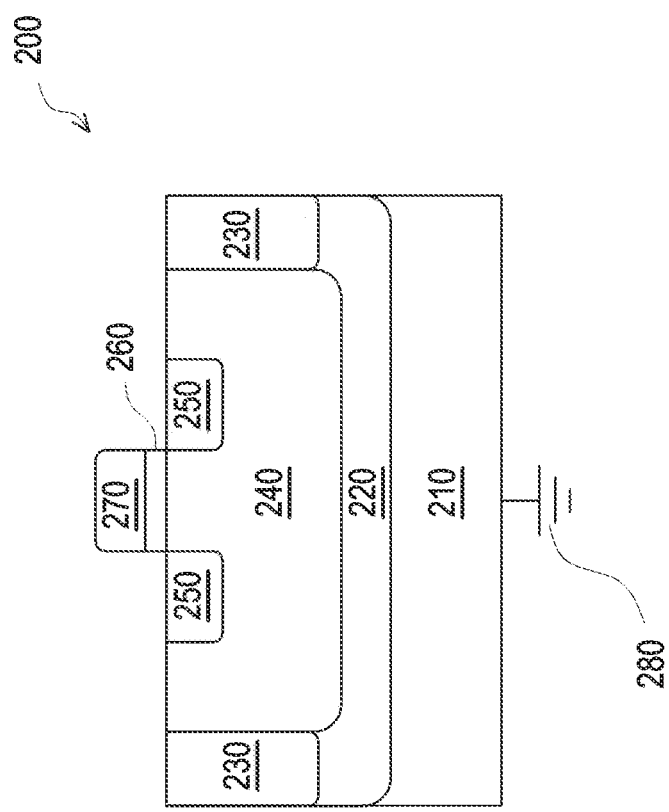
FIG. 2 is an illustration of a transistor structure in a deep n-well region, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In some embodiments, the terms "about" and "substantially" can indicate a value of a given quantity that varies within 5% of the value (e.g., ±1%, ±2%, +3%, ±4%, +5% of the value). These values are merely examples and are not intended to be limiting. The terms "about" and "substantially" can refer to a percentage of the values as interpreted by those skilled in the relevant art in light of the teachings herein.

As technology increases and the demand for scaled ICs grow, an increasing number of analog and digital cells are required to fit in smaller IC layout designs, thus creating challenges for IC manufacturers. Embodiments of the present disclosure address this challenge, among others, by optimizing the placement of analog and digital cells in an IC layout design.

An electronic design automation (EDA) tool can be used to place the analog and digital cells in the IC layout design. The analog cell can be a layout of an analog circuit, such as a serializer/deserializer (SerDes), an amplifier, a comparator, a phase-locked loop (PLL), an analog-to-digital converter (ADC), a digital-to-analog converter (DAC), and portions thereof, according to some embodiments of the present disclosure. The digital cell can be a layout of a circuit that performs a logic function, such as a NAND function, a NOR function, and an XOR function, according to some embodiments of the present disclosure. The digital cell can also be referred to as a "standard cell."

In some embodiments, the analog and digital cells can be placed in a common well region, such as a deep n-well region, so that a spacing between the two types of cells can be optimized. For example, without the common well region, the spacing between the analog and digital cells can be between about 3 μm and about 20 μm. With the analog and digital cells placed in the common well region, the spacing between the two types of cells can be improved to be between about 1 μm and about 3 μm. In addition to improving the spacing between the analog and digital cells, the common well region can provide a guard ring around the digital cells to protect these cells from disturbance, such as noise generated by adjacent analog cells.

Figure 1:
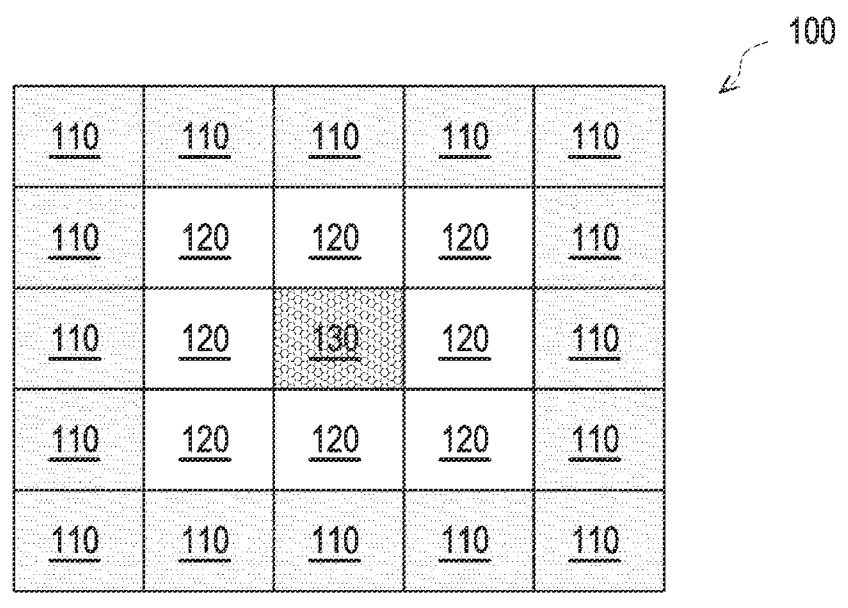

FIG. 1 is an illustration of a layout area 100 with analog and digital cells surrounded by a common well region, according to some embodiments of the present disclosure. Layout area 100 includes an analog cell 130 surrounded (and/or abutted) by digital cells 120. Analog cell 130 can include one or more layouts of an analog circuit, such as a SerDes, an amplifier, a comparator, a PLL, an ADC, a DAC, and circuit portions thereof, according to some embodiments of the present disclosure. Each of digital cells 120 can include one or more layouts of a circuit that performs a logic function, such as a NAND function, a NOR function, and an XOR function, according to some embodiments of the present disclosure.

Analog cell 130 and digital cells 120 can be placed in a common well region 110. In some embodiments, common well region 110 can be a deep n-well region. FIG. 2 is an illustration of a transistor structure 200 in a deep n-well region 220, according to some embodiments. Transistor structure 200 can be any type of transistor, such as a metal oxide semiconductor field effect transistor (MOSFET), a fin field effect transistor (finFET), a gate-all-around transistor field effect transistor (GAAFET), and any other type of suitable transistor.

Transistor structure 200 can be formed on a substrate 210. In addition to transistor structure 200, there may be other transistors and/or structures formed on substrate 210. Substrate 210 can be a semiconductor material, such as silicon, germanium (Ge), silicon germanium (SiGe), a silicon-on-insulator (SOI) structure, other suitable semiconductor materials, and a combination thereof. Further, substrate 210 can be doped with p-type dopants (e.g., boron, indium, aluminum, or gallium) or n-type dopants (e.g., phosphorus or arsenic). Substrate 210 can be electrically coupled to a reference voltage supply 280. In some embodiments, reference voltage supply 280 can be ground (e.g., 0 V).

Deep n-well region 220 can be formed in substrate 210, according to some embodiments of the present disclosure. Deep n-well region 220 can be doped with n-type dopants, such as phosphorous and arsenic. In some embodiments, deep n-well region is formed by an ion implantation process to provide peak n-type dopant concentration deep enough in substrate 210 to not affect device performance of transistor structure 200. In some embodiments, deep n-well region 220 includes deep n-well contact regions 230 to electrically couple deep n-well region 220 to a reference voltage supply, such as ground (e.g., 0 V), via multiple layers of metallization. Deep n-well region 220 can protect transistor structure 200 from disturbance, such as such as noise generated by an adjacent transistor formed on substrate 210.

A p-well region 240 can be formed in deep n-well region 220, according to some embodiments of the present disclosure. P-well region 240 can be doped with p-type dopants, such as boron, indium, aluminum, and gallium. Source/drain (S/D) regions 250 can be formed in p-well region 240. A gate oxide 260 can be formed on p-well region 240 and between S/D regions 250. A gate structure 270 can be formed on gate oxide 260.

Figure 3:
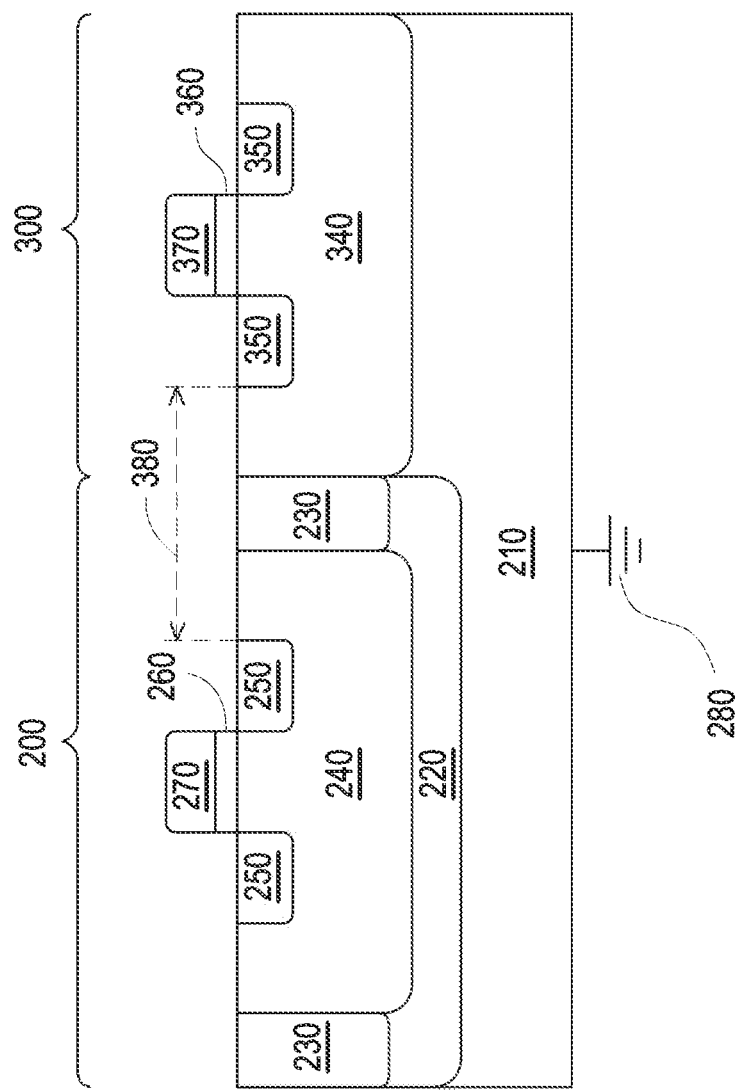
FIG. 3 is an illustration of a transistor structure in a deep n-well region adjacent to another transistor structure in the deep n-well region, according to some embodiments of the present disclosure.

FIG. 3 is an illustration of transistor structure 200 adjacent to a transistor structure 300, according to some embodiments of the present disclosure. Transistor structure 300 can be any type of transistor, such as a MOSFET, a finFET, a GAAFET, or any other type of suitable transistor. Transistor structure 300 can be formed in a p-well region 340, which can be doped with p-type dopants (e.g., boron, indium, aluminum, or gallium). S/D regions 350 can be formed in p-well region 340. A gate oxide 360 can be formed on p-well region 340 and between S/D regions 350. A gate structure 370 can be formed on gate oxide 360. In some embodiments, transistor structures 200 and 300 are p-type transistors.

In some embodiments, an impact of noise generated by transistor structure 300 on the device performance of transistor structure 200 can be mitigated by deep n-well region 220. The noise generated by transistor structure 300 can be, for example, from a switching current where transistor structure 300 can turn on and off repeatedly. Deep n-well region 220 can shield transistor structure 200 from coupling effects of the noise (e.g., switching current) generated by transistor structure 300, thus maintaining signal integrity in transistor structure 200. As a result, a spacing 380 between S/D region 250 of transistor structure 200 and S/D region 350 of transistor structure 300 can be optimized. In some embodiments, spacing 380 can be less than about 3 µm. For example, spacing 380 can be between about 1 µm and about 3 µm. Without deep n-well region 220 and in which transistor structures 200 and 300 would share a common p-well region (e.g., both transistor structures 200 and 300 are formed in p-well region 240), the spacing between S/D 250 of transistor structure 200 and S/D region 350 of transistor structure 300 would be between about 3 µm and 20 µm to sufficiently shield the transistors from noise.

Figure 4:
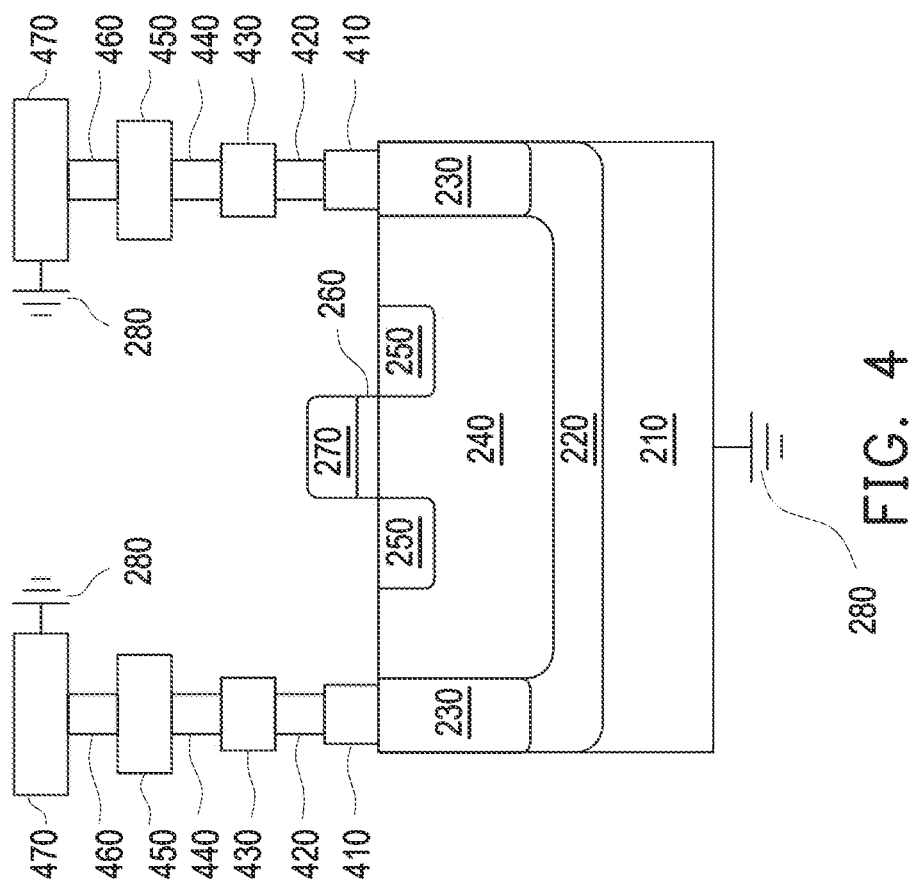
FIG. 4 is an illustration of a transistor structure with a deep n-well region electrically coupled to a reference voltage supply, according to some embodiments of the present disclosure.

FIG. 4 is an illustration of transistor structure 200 with deep n-well region 220 electrically coupled to a reference voltage supply, according to some embodiments of the present disclosure. In some embodiments, deep n-well region 220 can be electrically coupled to reference voltage supply 280 (e.g., 0 V) through deep n-well contact region 230, a first metallization interconnect structure in a first metallization layer 410 ("M1 interconnect structure 410"), a second interconnect structure in a second metallization layer 430 ("M2 interconnect structure 430"), a third interconnect structure in a third metallization layer 450 ("M3 interconnect structure 450"), and a fourth interconnect structure in a fourth metallization layer 470 ("M4 interconnect structure 470"). A via 420 can electrically couple M1 interconnect structure 410 to M2 interconnect structure 430. A via 440 can electrically couple M2 interconnect structure 430 to M3 interconnect structure 450. A via 460 can electrically couple M3 interconnect structure 450 to M4 interconnect structure 470. Reference voltage supply 280 can be electrically coupled to M4 interconnect structure 470.

Four metallization layers (e.g., M0, M1, M2, and M3) are illustrated in FIG. 4. In some embodiments, the number of metallization layers can be more than 4 (e.g., 5, 6, 7, 8, 9, or 10 metallization layers). In some embodiments, the number of metallization layers can be less than 4 (e.g., 2 or 3 metallization layers). Further, reference voltage supply 280 can be electrically coupled to more than one interconnect structure, according to some embodiments of the present disclosure. For example, in addition to M4 interconnect structure 470, reference voltage supply 280 can be electrically coupled to one or more of M1 interconnect structure 410, M2 interconnect structure 430, and M3 interconnect structure 450. In some embodiments, reference voltage supply 280 can be electrically coupled to each of M1 interconnect structure 410, M2 interconnect structure 430, M3 interconnect structure 450, and M4 interconnect structure 470. By electrically coupling one or more of M1 interconnect structure 410, M2 interconnect structure 430, M3 interconnect structure 450, and M4 interconnect structure 470 to reference voltage supply 280 (e.g., 0 V), transistor structure 200 can be shielded from noise generated by adjacent transistors (e.g., transistor structure 300 of FIG. 3), according to some embodiments of the present disclosure.

Figure 5:
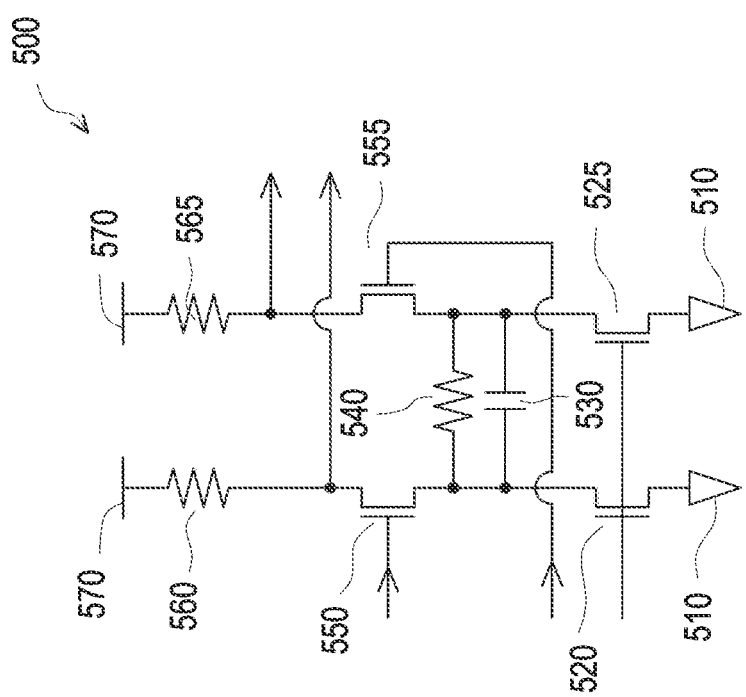
FIG. 5 is an illustration of an example analog circuit that performs a function representative of an analog cell, according to some embodiments of the present disclosure.

FIG. 5 is an illustration of an example analog circuit 500 that performs a function representative of an analog cell, according to some embodiments of the present disclosure. In some embodiments, analog circuit 500 (e.g., an amplifier circuit) can be a portion of a larger circuit, such as a SerDes. Further, analog circuit 500 can be representative of a circuit that could be implemented as an analog cell, such as analog cell 130 of FIG. 1. Based on the description herein, other analog circuits can be representative of a circuit that could be implemented as analog cell 130, such as an amplifier, a comparator, a PLL, an ADC, a DAC, and circuit portions thereof.

Analog circuit 500 includes n-type transistors 520, 525, 550 and 555, a capacitor structure 530, and resistor structures 540, 560, and 565. As illustrated in FIG. 5, first S/D regions of n-type transistors 520 and 525 can be electrically coupled to a first reference voltage supply 510, such as ground (e.g., 0 V). Second S/D regions of n-type transistors 520 and 535 can be electrically coupled to first S/D regions of n-type transistors 550 and 555, capacitor structure 530, and resistor structure 540. Further, second S/D regions of n-type transistors 550 and 555 can be electrically coupled to first terminals of resistor structures 560 and 565. Second terminals of resistor structures 560 and 565 can be electrically coupled to a second reference voltage supply, such as a power supply (e.g., 1.0 V, 1.2 V, 1.5 V, 3.0 V, and 5 V). In some embodiments, n-type transistors 520, 525, 550 and 555 can be any type of transistor, such as a MOSFET, a finFET, a GAAFET, and any other type of suitable transistor.

In referring to layout area 100 of FIG. 1, analog circuit 500 can be representative of an analog function performed by analog cell 130, according to some embodiments of the present disclosure. Further, digital cells 120 of FIG. 1 can be associated with control logic to operate analog circuit 500 and/or other logic functions. To shield digital cells 120 from the switching current generated by analog cell 130 (e.g., cell representative of analog circuit 500), common well region 110 surrounds digital cells 120. Further, as described above with respect to FIG. 4, common well region 110 can be electrically coupled to a reference voltage supply (e.g., reference voltage supply 280) through one or more interconnect structures (e.g., M1 interconnect structure 410, M2 interconnect structure 430, M3 interconnect structure 450, and M4 interconnect structure 470) to further shield digital cells 120 the switching current generated by analog cell 130.

Figure 6:
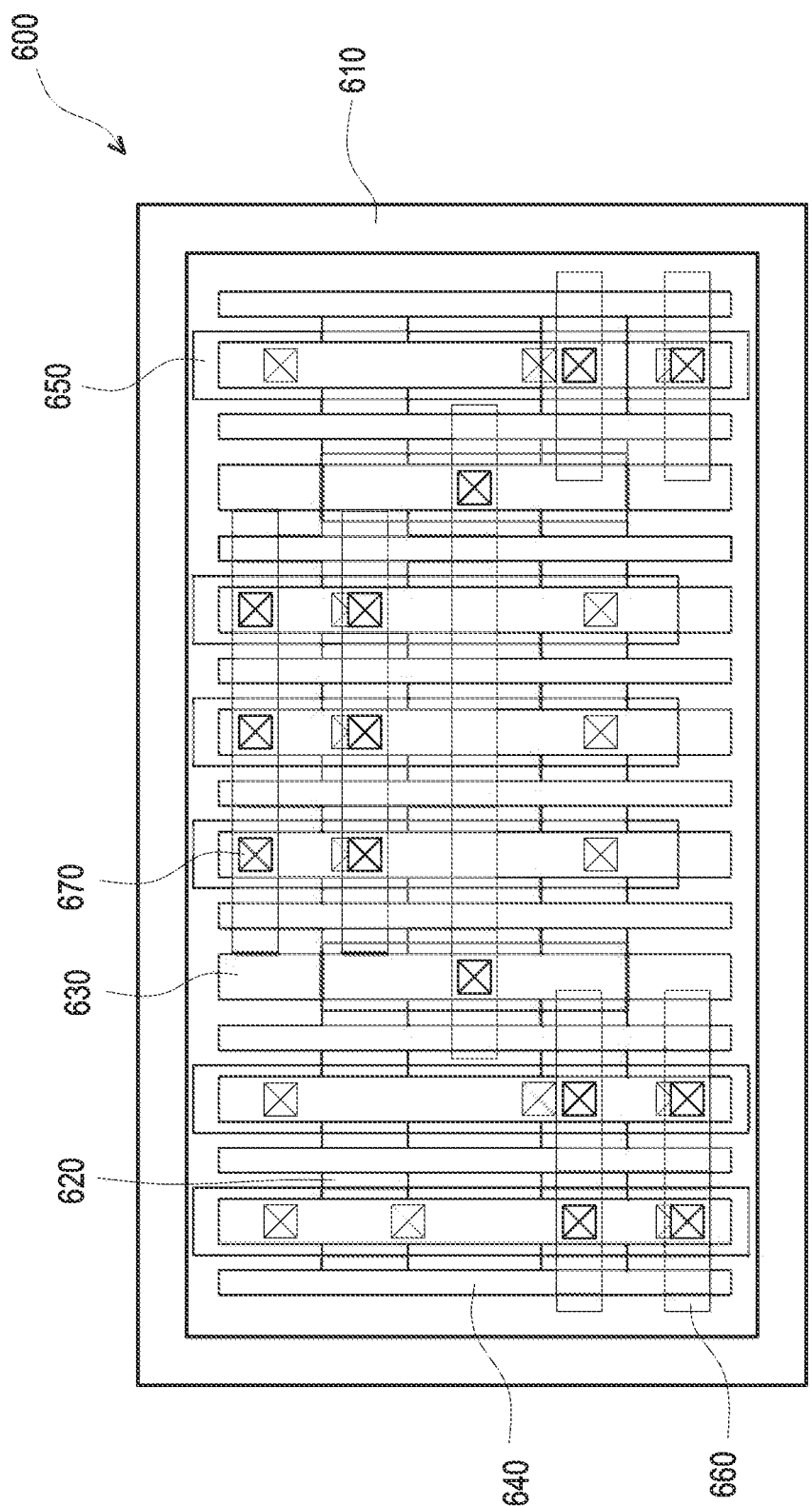
FIG. 6 is an illustration of an example layout of an analog circuit that performs a function representative of an analog cell, according to some embodiments of the present disclosure.

FIG. 6 is an illustration of an example layout 600 of an analog circuit that performs a function representative of an analog cell, according to some embodiments of the present disclosure. In some embodiments, layout 600 can represent a portion of a larger circuit layout, such as a SerDes layout. In some embodiments, layout 600 can be representative of analog circuit 500 of FIG. 5. Further, layout 600 can be representative of a layout that could be implemented as an analog cell, such as analog cell 130 of FIG. 1. Based on the description herein, other layouts can be representative of a layout that could be implemented as analog cell 130, such as layouts for an amplifier, a comparator, a PLL, an ADC, a DAC, and circuit portions thereof. Layout 600 illustrates various transistor features defined by a common well region 610, a gate region 620, a first diffusion region 630, a second diffusion region 640, a first metallization layer ("M1 metal layer") 650, a second metallization layer ("M2 metal layer") 660, and vias 670. In some embodiments, common well region 610 can be a deep n-well region.

Figure 7:
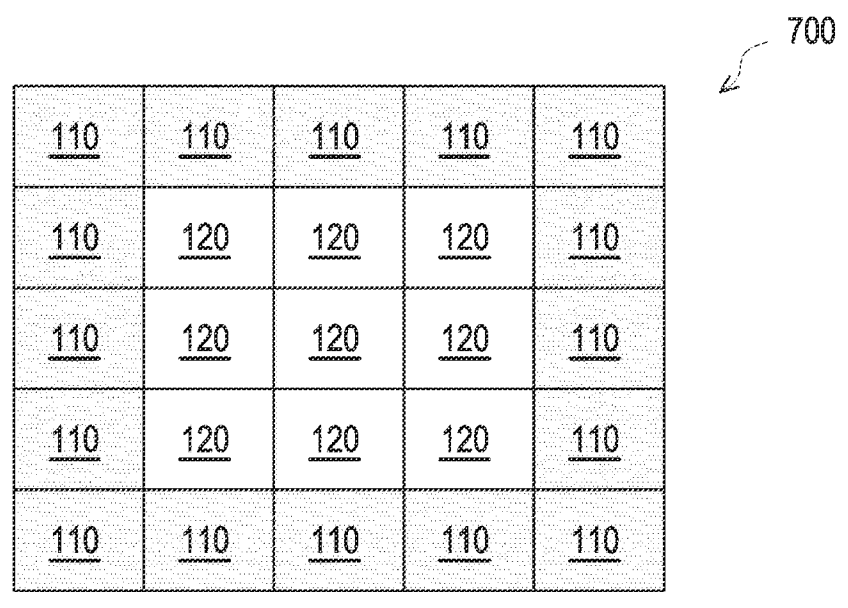

FIG. 7 is an illustration of a layout area 700 with digital cells surrounded by a common well region, according to some embodiments of the present disclosure. Layout area 700 includes digital cells 120 placed in common well region 110 (e.g., a deep n-well region), according to some embodiments of the present disclosure. A benefit of common well region 110 surrounding digital cells 120, among others, is that other cells (e.g., analog cell 130) can be placed in closer proximity to layout area 700 than would be possible without common well region 110. For example, without common well region 110, analog cell 130 would need to be placed between about 5 μm and 50 μm away from layout area 700 to shield digital cells from noise (e.g., switching current) generated by analog cell 130. But, with common well region 110, analog cell 130 can be placed between 1 μm and 3 μm away from layout area 700.

Figure 8:
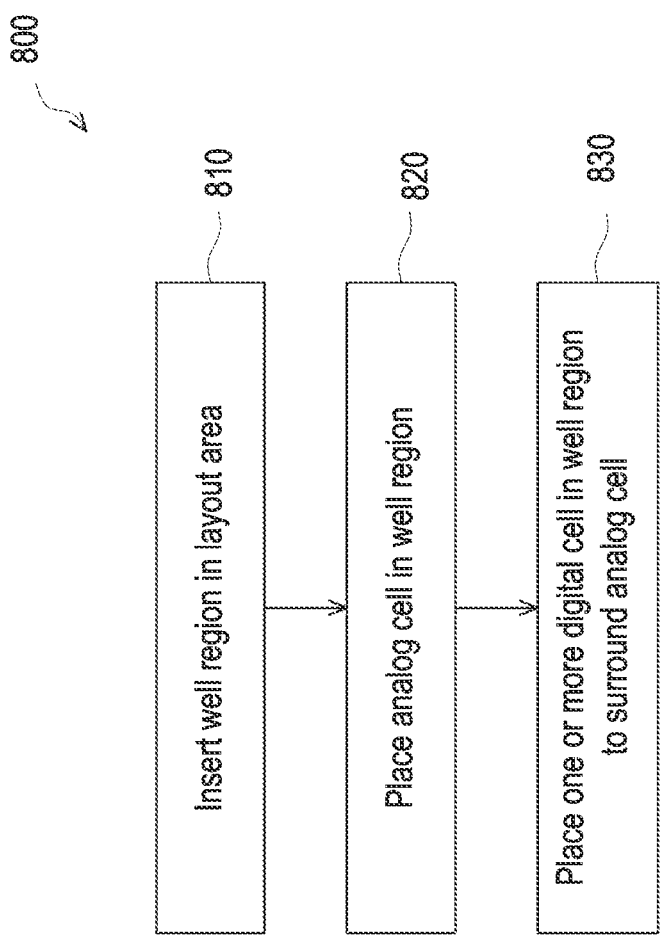
FIG. 8 is an illustration of a method for placing analog and digital cells in a layout area, according to some embodiments of the present disclosure.

FIG. 8 is an illustration of a method 800 for placing analog and digital cells in a layout area, according to some embodiments of the present disclosure. The operations depicted in method 800 can be performed by, for example, an EDA tool that operates on a computer system, such as an example computer system 900 described below with respect to FIG. 9. It is to be appreciated that not all operations may be needed to perform the disclosure provided herein and that one or more additional operations may be performed. Further, some of the operations may be performed concurrently or in a different order than shown in FIG. 8.

In operation 810, a well region is inserted in a layout area. In some embodiments, a deep n-well region can be inserted in the layout area. For example, layout area 100 of FIG. 1, layout 600 of FIG. 6, and layout area 700 of FIG. 7 illustrate a common well region, which can be a deep n-well region. The deep n-well region can include contact regions that are electrically coupled to a reference voltage supply (e.g., 0 V), as shown, for example, in transistor structure 200 of FIG. 4. In some embodiments, the contact regions can be electrically coupled to the reference voltage supply through interconnect structures in corresponding metallization layers (e.g., M1 interconnect structure 410, M2 interconnect structure 430, M3 interconnect structure 450, and M4 interconnect structure 470). Further, in some embodiments, a topmost interconnect of the interconnect structures (e.g., M4 interconnect structure 470) can be electrically coupled to the reference voltage supply. In addition to the topmost interconnect structure (e.g., M4 interconnect structure 470), the reference voltage supply can be electrically coupled to one or more of the interconnect structures (e.g., M1 interconnect structure 410, M2 interconnect structure 430, and M3 interconnect structure 450), according to some embodiments of the present disclosure. In some embodiments, the reference voltage supply can be electrically coupled to each of the interconnect structures (e.g., each of M1 interconnect structure 410, M2 interconnect structure 430, M3 interconnect structure 450, and M4 interconnect structure 470).

In operation 820, an analog cell is placed in the well region. In some embodiments, the analog cell can be any type of analog circuit, such as a SerDes, an amplifier, a comparator, a PLL, an ADC, and a DAC. Portions of an analog circuit—e.g., an amplifier circuit associated with the SerDes—can be placed in the well region.

In operation 830, one or more digital cells are placed in the well region to surround the analog cell. In some embodiments, the one or more digital cells surround (and/or abut) the analog cell. The one or more digital cells (or standard cells) can be any type of digital circuit that performs a logic function, such as a NAND function, a NOR function, and an XOR function.

Figure 9:
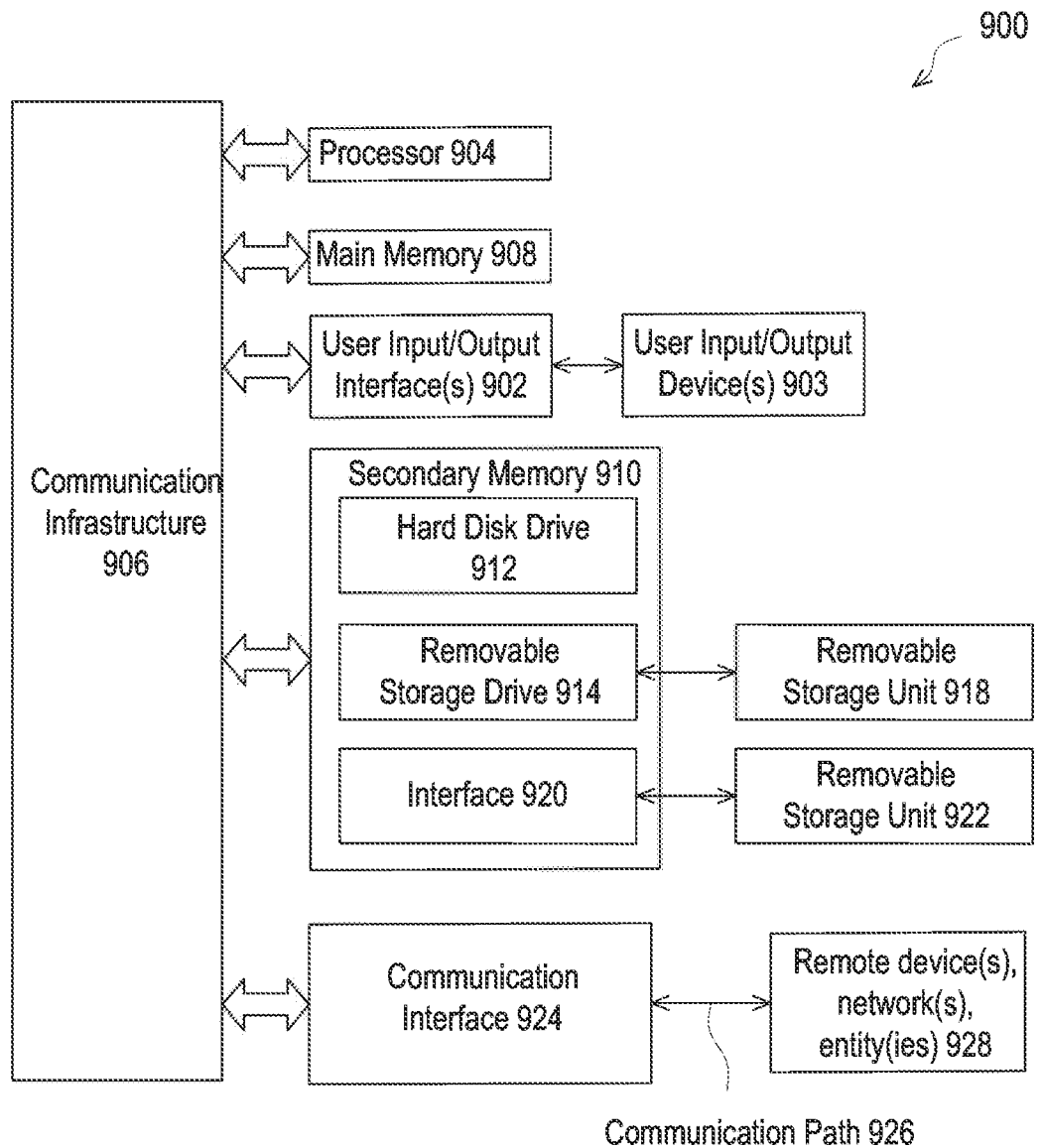
FIG. 9 is an illustration of an example computer system in which various embodiments of the present disclosure can be implemented, according to some embodiments of the present disclosure.

FIG. 9 is an illustration of an example computer system 900 in which various embodiments of the present disclosure can be implemented, according to some embodiments. Computer system 900 can be any well-known computer capable of performing the functions and operations described herein. For example, and without limitation, computer system 900 can be capable of placing analog and/or digital cells in an IC layout design using, for example, an EDA tool. Computer system 900 can be used, for example, to execute one or more operations in method 800, which describes an example method for placing analog and digital cells in a layout area.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., method 800 of FIG. 8—via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to method 800 of FIG. 8.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/any other computer data storage device. Removable storage drive 914 reads from and/or writes to removable storage unit 918 in a well-known manner.

According to some embodiments, secondary memory 910 can include other means, instrumentalities or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to method 800 of FIG. 8.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding embodiments can be implemented in a wide variety of configurations and architectures. Therefore, some or all of the operations in the preceding embodiments—e.g., method 800 of FIG. 8—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein.

Figure 10:
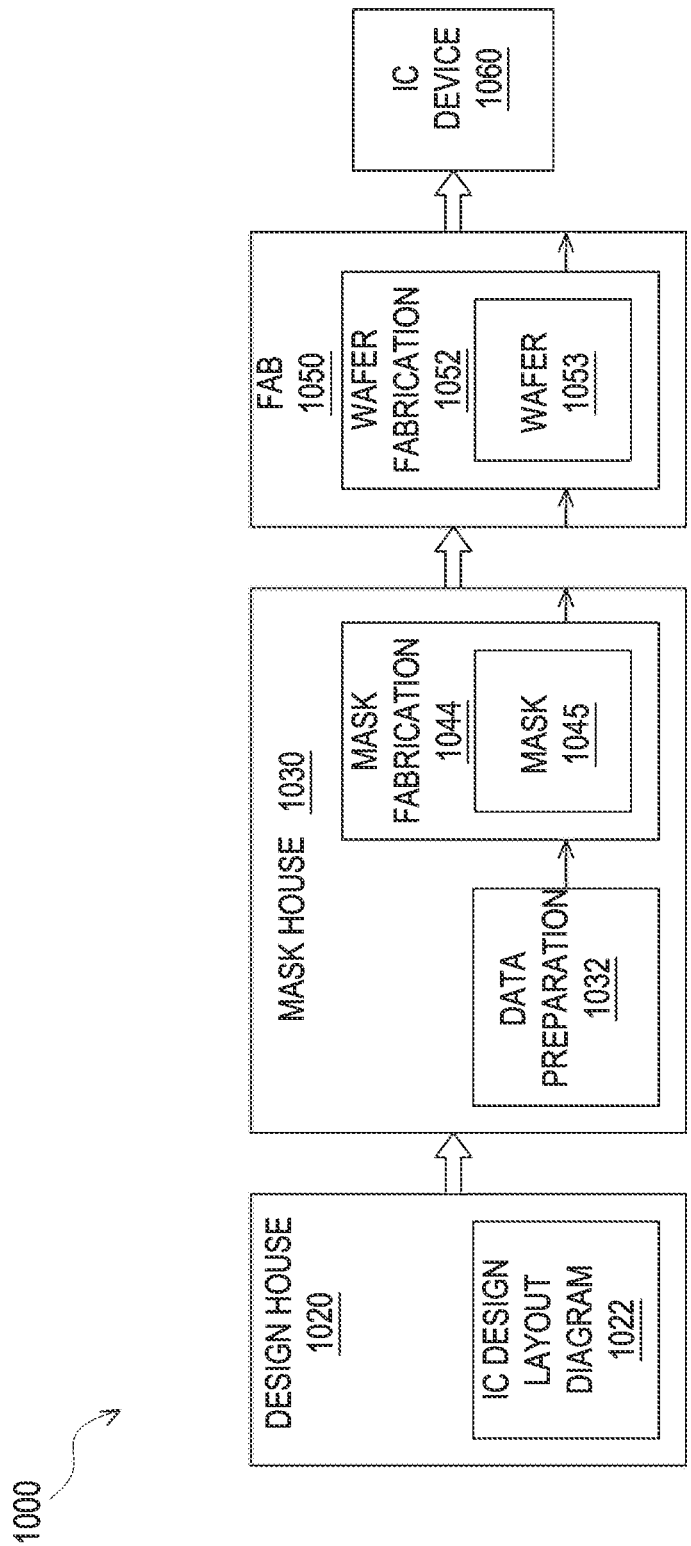
FIG. 10 is an illustration of an integrated circuit manufacturing system and associated integrated circuit manufacturing flow, according to some embodiments of the present disclosure.

FIG. 10 is an illustration of an IC manufacturing system 1000 and associated IC manufacturing flow, according to some embodiments. In some embodiments, the layouts described herein—e.g., layout area 100 of FIG. 1, layout 600 of FIG. 6, layout area 700 of FIG. 7, and associated circuit structures—can be fabricated using IC manufacturing system 1000.

IC manufacturing system 1000 includes a design house 1020, a mask house 1030, and an IC manufacturer/fabricator ("fab") 1050—each of which interacts with one another in the design, development, and manufacturing cycles and/or services related to manufacturing an IC device 1060. Design house 1020, mask house 1030, and fab 1050 are connected by a communications network. In some embodiments, the communications network is a single network. In some embodiments, the communications network is a variety of different networks, such as an intranet and the Internet. The communications network includes wired and/or wireless communication channels. Each of design house 1020, mask house 1030, and fab 1050 interacts with one another and provides services to and/or receives services from one another. In some embodiments, two or more of design house 1020, mask house 1030, and fab 1050 coexist in a common facility and use common resources.

Design house 1020 generates an IC design layout diagram 1022. IC design layout diagram 1022 includes various geometrical patterns, such as the patterns shown in layout area 100 of FIG. 1, layout 600 of FIG. 6, layout area 700 of FIG. 7, and associated circuit structures. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, a gate electrode, a source and drain, and conductive segments or vias of an interlayer interconnection, to be formed in a semiconductor substrate (e.g., a silicon wafer) and various material layers disposed on the semiconductor substrate. Design house 1020 implements a proper design procedure to form IC design layout diagram 1022. The design procedure includes one or more of logic design, physical design, and place and route design. IC design layout diagram 1022 can be presented in one or more data files with information on the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer that converts the RDF to an image on a substrate, such as a mask (or reticle) 1045 or a semiconductor wafer 1053. IC design layout diagram 1022 can be manipulated by mask data preparation 1032 to comply with particular characteristics of the mask writer and/or requirements of fab 1050. In FIG. 10, data preparation 1032 and mask fabrication 1044 are illustrated as separate elements. In some embodiments, data preparation 1032 and mask fabrication 1044 can be collectively referred to as "mask data preparation."

In some embodiments, data preparation 1032 includes optical proximity correction (OPC), which uses lithography enhancement techniques to compensate for image errors, such as those that can arise from diffraction, interference, and other process effects. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and combinations thereof. In some embodiments, inverse lithography technology (ILT) can be used, which treats OPC as an inverse imaging problem.

In some embodiments, data preparation 1032 includes a mask rule checker (MRC) that checks whether IC design layout diagram 1022 has undergone OPC with a set of mask creation rules that include geometric and/or connectivity restrictions to ensure sufficient margins, to account for variability in semiconductor manufacturing processes. In some embodiments, the MRC modifies IC design layout diagram 1022 to compensate for limitations during mask fabrication 1044, which may undo part of the modifications performed by OPC to meet mask creation rules.

In some embodiments, data preparation 1032 includes lithography process checking (LPC) that simulates processing that will be implemented by fab 1050 to fabricate IC device 1060. LPC simulates this processing based on IC design layout diagram 1022 to create a simulated manufactured device, such as IC device 1060. The processing parameters in the LPC simulation can include parameters associated with various processes of the IC manufacturing cycle, parameters associated with tools used for IC manufacturing, and/or other aspects of the manufacturing process. LPC takes into account various factors, such as aerial image contrast, depth of focus (DOF), mask error enhancement factor (MEEF), and other suitable factors. In some embodiments, after a simulated manufactured device has been created by LPC and if the simulated device does not satisfy design rules, OPC and/or MRC are be repeated to further refine IC design layout diagram 1022.

In some embodiments, data preparation 1032 includes additional features, such as a logic operation (LOP) to modify IC design layout diagram 1022 based on manufacturing rules. Additionally, the processes applied to IC design layout diagram 1022 during data preparation 1032 may be executed in a different order than described above.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams are used to form a pattern on a mask (photomask or reticle) 1045 based on the modified IC design layout diagram 1022.

Mask 1045 can be formed by various technologies. In some embodiments, mask 1045 is formed using binary technology. In some embodiments, a mask pattern includes opaque regions and transparent regions. A radiation beam, such as an ultraviolet (UV) beam, can be used to expose the image sensitive material layer (e.g., photoresist) coated on a wafer. The radiation beam is blocked by the opaque region and transmits through the transparent regions. For example, a binary mask version of mask 1045 includes a transparent substrate (e.g., fused quartz) and an opaque material (e.g., chromium) coated in the opaque regions of the binary mask.

In some embodiments, mask 1045 is formed using a phase shift technology. In a phase shift mask (PSM) version of mask 1045, various features in the pattern formed on the phase shift mask are configured to have proper phase difference to enhance the resolution and imaging quality. For example, the phase shift mask can be attenuated PSM or alternating PSM.

The mask generated by mask fabrication 1044 is used in a variety of processes. For example, the mask can be used in an ion implantation process to form various doped regions in semiconductor wafer 1053, in an etching process to form various etching regions in semiconductor wafer 1053, and/or in other suitable processes.

Fab 1050 includes wafer fabrication 1052. Fab 1050 can include one or more manufacturing facilities for the fabrication of a variety of different IC products. In some embodiments, fab 1050 is a semiconductor foundry. For example, there may be a manufacturing facility for front-end fabrication of IC products (front-end-of-line (FEOL) fabrication), a second manufacturing facility to provide back end fabrication for the interconnection and packaging of the IC products (back-end-of-line (BEOL) fabrication), and a third manufacturing facility to provide other services for the foundry business.

Fab 1050 uses mask 1045 fabricated by mask house 1030 to fabricate IC device 1060. In some embodiments, semiconductor wafer 1053 is fabricated by fab 1050 using mask 1045 to form IC device 1060. In some embodiments, the IC fabrication includes performing one or more lithographic exposures based on IC design layout diagram 1022. Semiconductor wafer 1053 includes a silicon substrate or other appropriate substrate with material layers formed thereon. Semiconductor wafer 1053 further includes doped regions, dielectric features, multilevel interconnects, and other suitable features.

Figure 11:
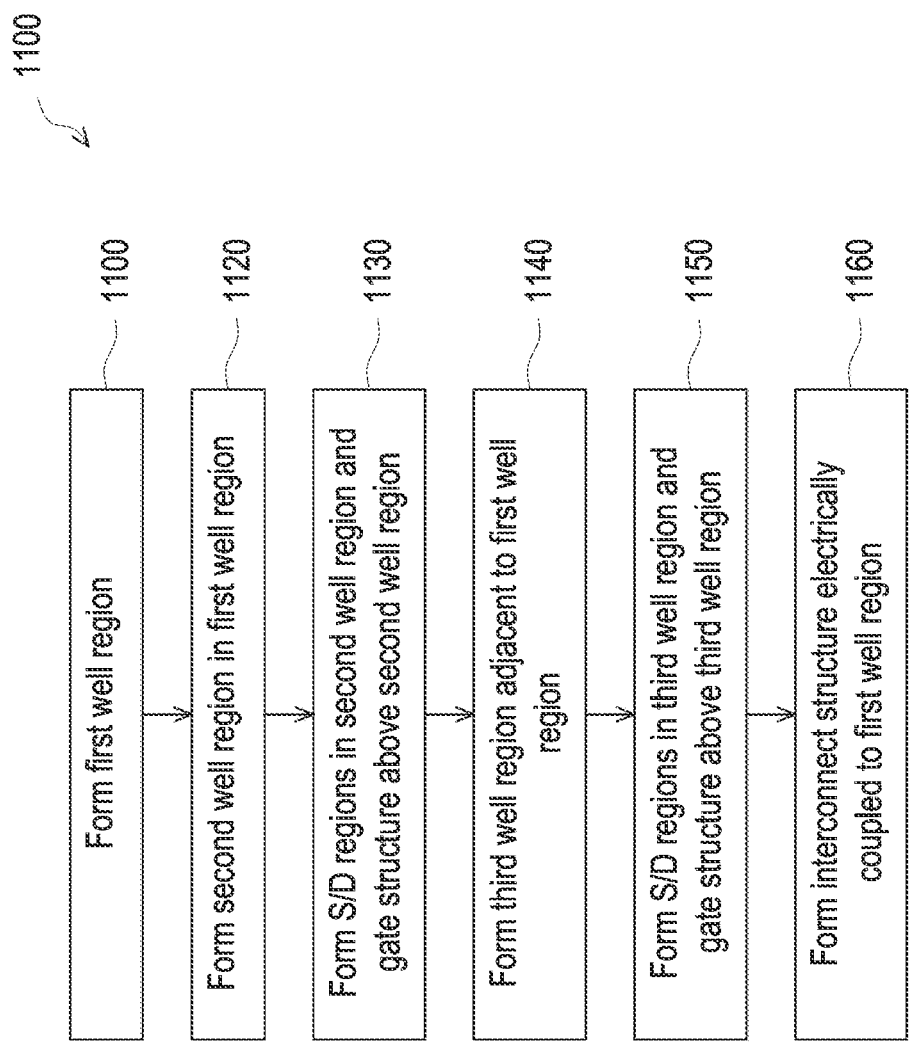
FIG. 11 is an illustration of a method for forming transistor structures, according to some embodiments of the present disclosure.

FIG. 11 is an illustrations of a method 1100 for forming transistor structures, according to some embodiments of the present disclosure. FIGS. 12A-12F illustrate cross-sectional view of the transistor structures in FIGS. 3 and 4 at various operations of method 1100. For explanation purposes, the operations shown in method 1100 are described in context of FIGS. 12A-12F. In some embodiments, the operations of method 1100 can be performed in a different order and/or vary.

At operation 1110, a first well region is formed in a substrate. Referring to FIG. 12A, deep n-well region 220 is formed in substrate 210. Deep n-well region 220 can be doped with n-type dopants, such as phosphorous and arsenic. In some embodiments, deep n-well region is formed by an ion implantation process to provide peak n-type dopant concentration deep enough in substrate 210 to not affect device performance of transistor structure 200.

Figure 12B:
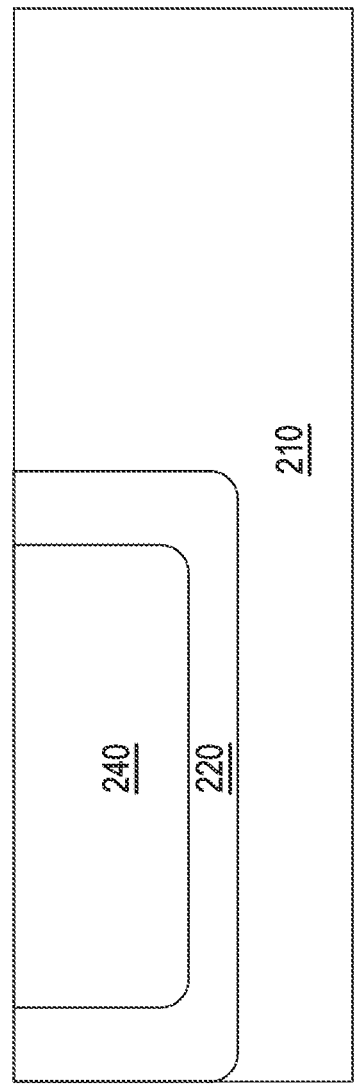

At operation 1120, a second well region is formed in the first well region. Referring to FIG. 12B, p-well region 240 is formed in deep n-well region 220. P-well region 240 can be doped with p-type dopants, such as boron, indium, aluminum, and gallium.

Figure 12C:
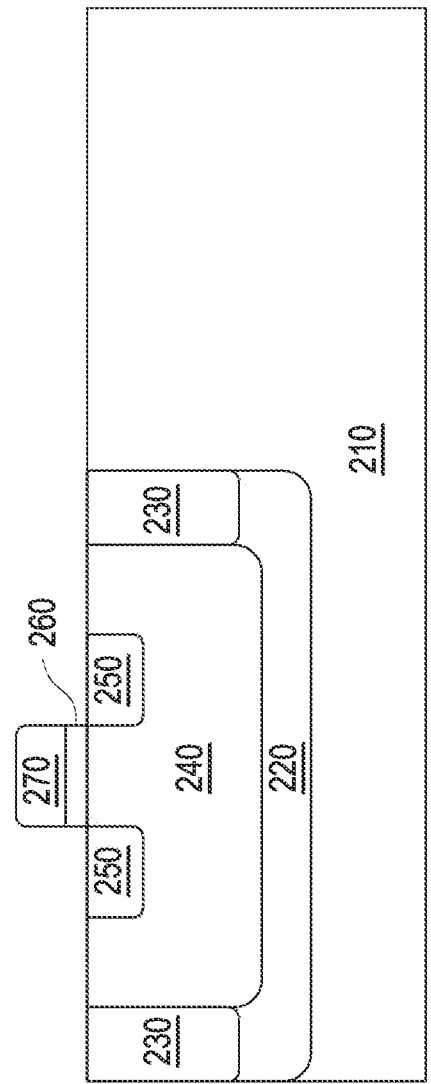

At operation 1130, source/drain (S/D) regions are formed in the second well region and a gate structure is formed above the second well region. Referring to FIG. 12C, S/D regions 250 are formed in p-well region 240. Further, gate oxide 260 and gate structure 270 are formed above p-well region 240 and between S/D regions 250. Deep n-well contact regions 230 can also be formed and be doped with n-type dopants, such as phosphorous and arsenic.

Figure 12D:
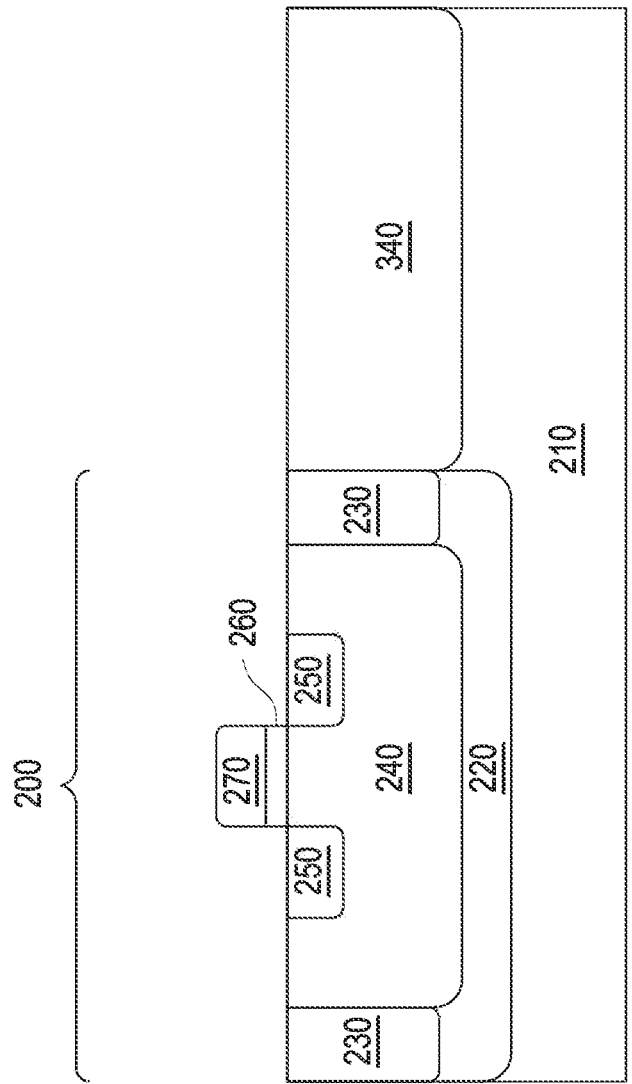

At operation 1140, a third well region is formed the substrate and is adjacent to the first well region. Referring to FIG. 12D, p-well region 340 is formed in substrate 210 and is adjacent to deep n-well region 220. In some embodiments, transistor structure 200 can be masked while p-well region 340 is formed in substrate 210. Deep n-well contact region 230 is located between p-well region 240 and p-well region 340.

Figure 12E:
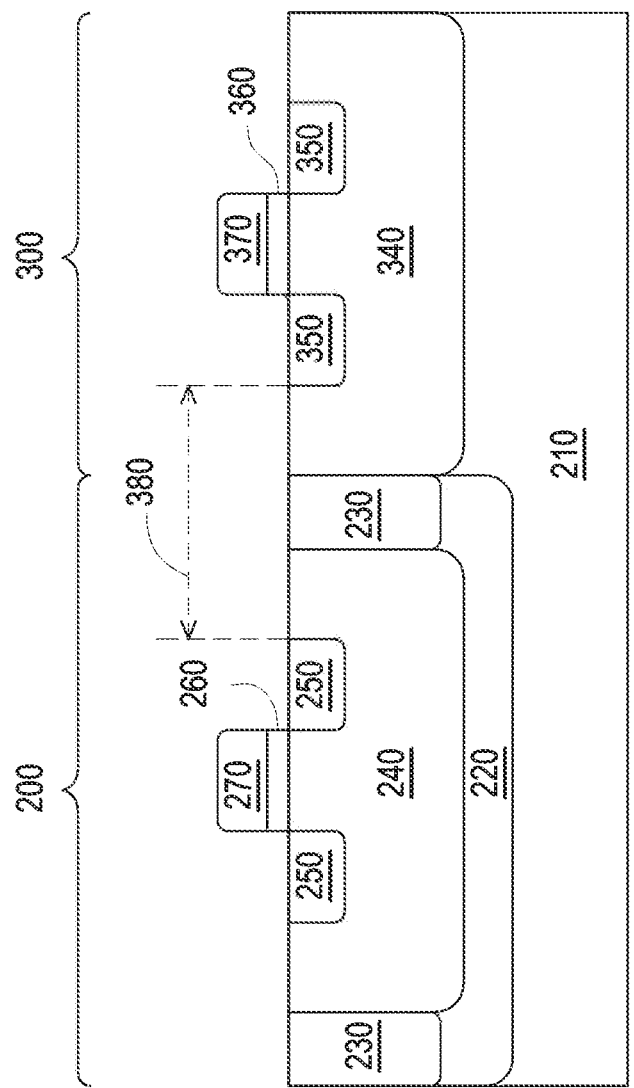

At operation 1150, S/D regions are formed in the third well region and a gate structure is formed above the third well region. Referring to FIG. 12E, S/D regions 350 are formed in p-well region 340. Further, gate oxide 360 and gate structure 370 are formed above p-well region 340 and between S/D regions 350. Spacing 380—between a nearest S/D region 250 of transistor structure 200 and a nearest S/D region 350 of transistor structure 300—can be less than about 3 µm.

Figure 12F:
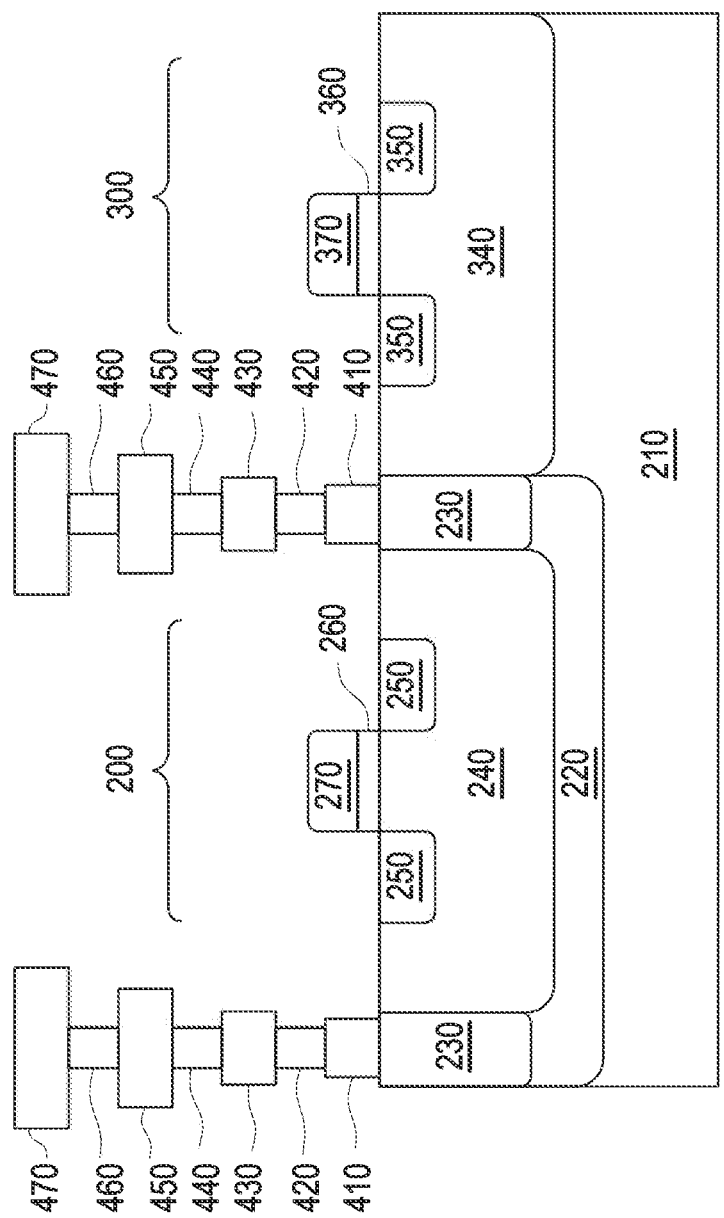

At operation 1160, an interconnect structure is formed and electrically coupled to the first well region. Referring to FIG. 12F, M1 interconnect structure 410, M2 interconnect structure 430, M3 interconnect structure 450, and M4 interconnect structure 470—as well as vias 420, 440, and 460—are formed and electrically coupled to deep n-well region 220 through deep n-well contact regions 230. In some embodiments, the number of metallization layers can be more than 4 (e.g., 5, 6, 7, 8, 9, or 10 metallization layers). In some embodiments, the number of metallization layers can be less than 4 (e.g., 2 or 3 metallization layers). Further, the number of vias between pairs of metallization layers can vary based on the number of metallization layers. The metallization layers and the vias can all (or a portion thereof) be electrically coupled to a reference voltage supply, such as ground (e.g., 0 V).

As technology increases and the demand for scaled ICs grow, an increasing number of standard cells are required to fit in smaller IC layout designs, thus creating challenges for IC manufacturers. Embodiments of the present disclosure address this challenge, among others, by optimizing the placement of analog and digital cells in an IC layout design. In some embodiments, the analog and digital cells can be placed in a common well region, such as a deep n-well region, so that a spacing between the two types of cells can be optimized. For example, without the common well region, the spacing between the analog and digital cells can be between about 3 µm and about 20 µm. With the analog and digital cells placed in the common well region, the spacing between the two types of cells can be improved to be between about 1 µm and about 3 µm. In addition to improving the spacing between the analog and digital cells, the common well region can provide a guard ring around the digital cells to protect these cells from disturbance, such as noise generated by adjacent analog cells.

Embodiments of the present disclosure describe a structure. The structure includes: a substrate; a first well region in the substrate; a second well region in the first well region and including a first source/drain (S/D) region; and, a third well region in the substrate and adjacent to the first well region and including a second S/D region. A spacing between the first and second S/D regions is less than about 3 µm.

Embodiments of the present disclosure describe another structure. The structure includes: a substrate; a first well region in the substrate; a second well region in the first well region and including a first source/drain (S/D) region and a second S/D region; a gate structure above the second well region and between the first and second S/D regions; a contact region in the first well region and adjacent to the second well region; and, an interconnect structure electrically coupled to the contact region. The interconnect structure metallization layers and at least one via between each of the metallization layers. The metallization layers and the at least one via are electrically coupled to a reference voltage supply.

Embodiments of the present disclosure describe a method. The method includes: forming a first well region in a substrate; forming a second well region in the first well region; forming a first source/drain (S/D) region and a second S/D region in the second well region; forming a third well region in the substrate and adjacent to the first well region; and, forming a third S/D region and a fourth S/D region in the third well region. A spacing between a nearest third S/D region or fourth S/D region and a nearest first S/D region or second S/D region is less than about 3 µm.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    an analog circuit disposed on a substrate and comprising a first transistor disposed in a first well region, wherein the first transistor comprises a first source/drain (S/D) region; and
    a digital circuit disposed on the substrate and comprising a second transistor, wherein the second transistor comprises:
        a second well region; and
        a third well region in the second well region and comprising a second (S/D) region;
        wherein the first transistor is adjacent to the second transistor, and wherein a spacing between the first and second S/D regions is less than about 3 µm.

2. The structure of claim 1, further comprising:
    a contact region in the second well region and located between the first and third well regions.

3. The structure of claim 1, wherein the substrate is electrically coupled to a reference voltage supply.

4. The structure of claim 1, wherein:
the first well region further comprises a third S/D region and a first gate structure; and
the third well region further comprises a fourth S/D region and a second gate structure;
wherein the first well region, first S/D region, third S/D region, and first gate structure form portions of the first transistor; and
wherein the second well region, third well region, second S/D region, fourth S/D region, and second gate structure form portions of the second transistor.

5. The structure of claim 1, wherein the first and second transistors are p-type transistors.

6. The structure of claim 1, wherein the second well region comprises a deep n-well region.

7. The structure of claim 1, wherein the third well region comprises a p-well region.

8. The structure of claim 1, wherein the first well region comprises a p-well region.

9. A structure, comprising:
a substrate electrically coupled to a reference voltage supply;
a first well region in the substrate;
a second well region in the first well region and comprising a first source/drain (S/D) region and a second S/D region;
a gate structure above the second well region and between the first and second S/D regions;
a contact region in the first well region and adjacent to the second well region; and
an interconnect structure electrically coupled to the contact region, wherein the interconnect structure comprises a plurality of metallization layers and at least one via between each of the plurality of metallization layers, and wherein the plurality of metallization layers and the at least one via are electrically coupled to the reference voltage supply.

10. The structure of claim 9, further comprising:
a third well region adjacent to the first well region and comprising a third S/D region spaced apart from a nearest one of the first and second S/D regions by a distance less than about 3 μm.

11. The structure of claim 10, wherein the third well region comprises a p-well region.

12. The structure of claim 9, wherein the reference voltage supply is ground.

13. The structure of claim 9, wherein the first well region comprises a deep n-well region.

14. The structure of claim 9, wherein the second well region comprises a p-well region.

15. The structure of claim 9, wherein the first well region, second well region, first S/D region, second S/D region, and gate structure form portions of a p-type transistor.

16. A method, comprising:
forming a digital portion of a circuit on a substrate, wherein forming the digital portion comprises:
forming a first well region in the substrate;
forming a second well region in the first well region; and
forming a first source/drain (S/D) region and a second S/D region in the second well region; and
forming an analog portion of the circuit on the substrate, wherein forming the analog portion comprises:
forming a third well region in the substrate and adjacent to the first well region; and
forming a third S/D region and a fourth S/D region in the third well region, wherein a spacing between a nearest third S/D region or fourth S/D region and a nearest first S/D region or second S/D region is less than about 3 μm.

17. The method of claim 16, wherein forming the digital portion further comprises:
forming a contact region in the first well region and located between the second and third well regions.

18. The method of claim 17, further comprising:
forming an interconnect structure electrically coupled to the contact region, wherein the interconnect structure comprises a plurality of metallization layers and at least one via between each of the plurality of metallization layers, and wherein the plurality of metallization layers and the at least one via are electrically coupled to a reference voltage supply.

19. The method of claim 16, wherein forming the first well region comprises forming a deep n-well region.

20. The method of claim 16, wherein forming the second well region comprises forming a p-well region.

* * * * *